US008872326B2

(12) United States Patent
Lin et al.

(10) Patent No.: US 8,872,326 B2
(45) Date of Patent: Oct. 28, 2014

(54) THREE DIMENSIONAL (3D) FAN-OUT PACKAGING MECHANISMS (75) Inventors: Jing-Cheng Lin, Chu Tung Zhen (TW); Chin-Chuan Chang, Zhudong Township (TW); Jui-Pin Hung, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/597,868

(22) Filed: Aug. 29, 2012

(65) Prior Publication Data
US 2014/0061888 A1 Mar. 6, 2014

(51) Int. Cl.
H01L 23/48 (2006.01)

(52) U.S. Cl.
USPC .... 257/690; 257/684; 257/E21.51; 257/E21.511

(58) Field of Classification Search
USPC .................................. 257/684, 690
See application file for complete search history.

(56) References Cited

U.S. PATENT DOCUMENTS

| 7,550,680 | B2 | 6/2009 | Pendse |
| 7,825,520 | B1* | 11/2010 | Longo et al. ............. 257/777 |
| 7,851,259 | B2 | 12/2010 | Kim |
| 2008/0174008 | A1* | 7/2008 | Yang et al. ............. 257/723 |
| 2008/0258289 | A1 | 10/2008 | Pendse et al. |
| 2010/0314254 | A1 | 12/2010 | Kodani |
| 2011/0068427 | A1* | 3/2011 | Paek et al. ............. 257/433 |
| 2011/0101527 | A1 | 5/2011 | Cheng et al. |
| 2011/0115081 | A1 | 5/2011 | Osumi |
| 2011/0194265 | A1* | 8/2011 | Su et al. ............. 361/761 |
| 2011/0278736 | A1* | 11/2011 | Lin et al. ............. 257/774 |
| 2012/0056312 | A1* | 3/2012 | Pagaila et al. ............. 257/684 |
| 2012/0228754 | A1* | 9/2012 | Liu et al. ............. 257/676 |
| 2013/0093078 | A1* | 4/2013 | Lin et al. ............. 257/737 |
| 2013/0105973 | A1* | 5/2013 | Gan et al. ............. 257/738 |
| 2013/0105991 | A1* | 5/2013 | Gan et al. ............. 257/777 |
| 2013/0182402 | A1* | 7/2013 | Chen et al. ............. 361/807 |
| 2013/0249106 | A1* | 9/2013 | Lin et al. ............. 257/774 |

FOREIGN PATENT DOCUMENTS

JP 2010-287742 12/2010

OTHER PUBLICATIONS

Office Acton dated Jul. 23, 2014 from corresponding application No. DE 10 2013 101 192.6.
Office Action dated Jun. 19, 2014 and English translation from corresponding application No. KR 10-2012-0154757.

* cited by examiner

Primary Examiner — A. Sefer
(74) Attorney, Agent, or Firm — Lowe Hauptman & Ham, LLP (57) ABSTRACT The mechanisms of forming a semiconductor device package described above provide a low-cost manufacturing process due to the relative simple process flow. By forming an interconnecting structure with a redistribution layer(s) to enable bonding of one or more dies underneath a package structure, the warpage of the overall package is greatly reduced. In addition, interconnecting structure is formed without using a molding compound, which reduces particle contamination. The reduction of warpage and particle contamination improves yield. Further, the semiconductor device package formed has low form factor with one or more dies fit underneath a space between a package structure and an interconnecting structure.

20 Claims, 7 Drawing Sheets

THREE DIMENSIONAL (3D) FAN-OUT PACKAGING MECHANISMS

BACKGROUND

With the continued evolution of semiconductor technologies, semiconductor chips/dies are becoming increasingly smaller. In the meantime, more functions are being integrated into the semiconductor dies. Accordingly, the semiconductor dies have increasingly greater numbers of input/output (I/O) pads packed into smaller areas. As a result, the packaging of the semiconductor dies becomes more important and more challenging.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Figure 1A:
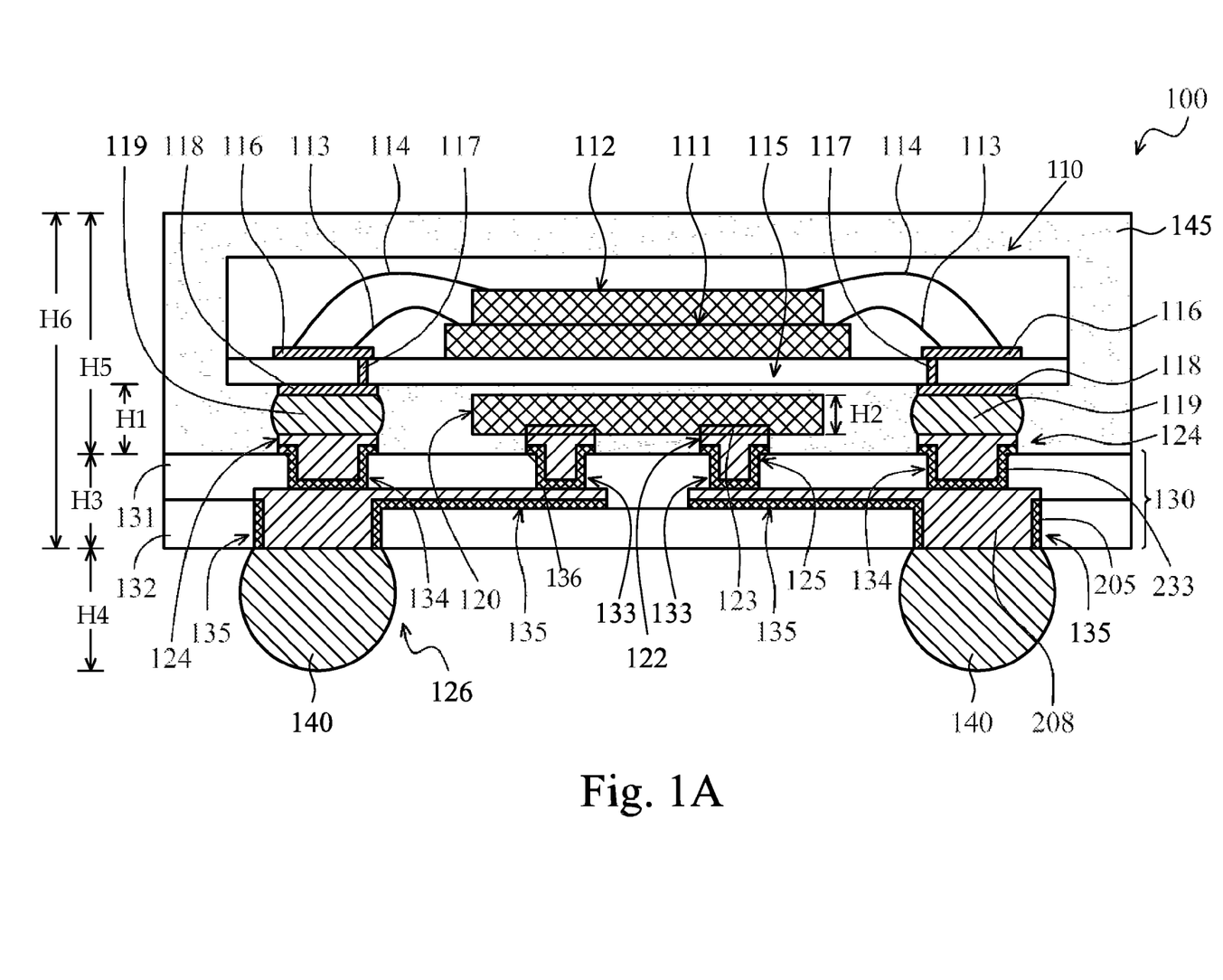
FIG. 1A is a cross-sectional view of a package, in accordance with some embodiments.

FIG. 1A is a cross-sectional view of a package 100, in accordance with some embodiments. Package 100 includes a package structure 110 and a die 120. Package structure 110 includes semiconductor dies 111 and 112. In some embodiments, each of the semiconductor dies 111 and 112 includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Semiconductor dies 111 and 112 are disposed on a substrate 115, which has contacts 116 on a surface thereof. Substrate 115 of package structure 110 has interconnect structures 117 connecting contacts 116 on one surface of substrate 115 to contacts 118 on an opposing surface of the substrate, as shown in FIG. 1A. Semiconductor dies 111 and 112 are electrically connected to contacts 116 by wires 113 and 114 respectively, in accordance with some embodiments. Semiconductor dies 111 and 112 may also be connected to contacts 116 by other means. Interconnect structures 117 in substrate 115 may include metal lines and vias. In some embodiments, the vias of interconnect structures 117 include through substrate vias (TSVs), or through substrate holes (TSHs). Contacts 118 on the opposing surface of substrate 115 include metal pads. Contacts 118 may also include a solder layer (not shown) prior to bonding with an interconnecting structure 130. The solder layer forms a portion of each connector 119. Connectors 119, such as solder bumps or solder balls, are attached to contacts 118. In some embodiments, the widths (or diameters) of connectors 119 are in a range from about 100 µm to about 400 µm. Connectors 119 and contacts 118 form bonding structures 124.

As described above, package 100 also includes die 120. Die 120 has contacts 122, which are surrounded by one or more passivation layers (not shown). In some embodiments, contacts 122 include metal pads 123 and bumps formed over metal pads 123. The bumps of contacts 122 may be solder bumps and/or may include copper pillars. The solder bumps of contacts 122 form bonding structures 125 between dies 120 and interconnecting structure 130. In some embodiments, the widths (or diameters) of bonding structure 125 are in a range from about 20 µm to about 100 µm. Connectors 119 are larger than contacts 122, in accordance with some embodiments.

A distance between a bottom surface of package structure 110 to a top surface of interconnecting structure 130 is labeled as $H_1$ in FIG. 1A. In some embodiments, $H_1$ is in a range from about 100 µm to about 400 µm. FIG. 1A also shows the thickness of die 120 is $H_2$. $H_2$ is smaller than $H_1$, which allows die 120 to utilize a space between package structure 110 and interconnecting structure 130.

As shown in FIG. 1A, package structure 110 and die 120 are disposed over and electrically connected to interconnecting structure 130. The interconnecting structure 130 includes one or more dielectric layers, such as dielectric layers 131 and 132. The dielectric layers 131 and 132 may be soft (or yielding) to absorb stress of the bonding process(es) involved in forming package 100. The material for each of dielectric layers 131 and 132 may be selected from photo-definable solder resists, a polymer such as polyimide, polybenzoxazole (PBO), benzocyclobutene (BCB), molding compound, and the like.

The interconnecting structure 130 has small contacts 133 bonding with contacts 122 on die 120 to form bonded structures 125. The interconnecting structure 130 also has large contacts 134 bonding with connectors 119 of package structure 110 to form bonded structures 124. Small contacts 133 are smaller than large contacts 134, in accordance with some embodiments. Further, interconnecting structure 130 has contacts 135 bonding with connecting elements 140, which are used to make external connections with an external substrate, such as a printed circuit board (PCB), or another package. A height of connecting element 140 is labeled as $H_5$ in FIG. 1A. In some embodiments, $H_5$ is in a range from about 100 μm to about 400 μm.

In some embodiments, dielectric layer 131 has a thickness in a range from about 3 μm to about 25 μm. In some embodiments, passivation layer 132 has a thickness in a range from about 3 μm to about 15 μm. A total thickness of interconnecting structure 130 is labeled as $H_3$ in FIG. 1A. In some embodiments, $H_3$ is in a range from about 6 μm to about 30 μm. In some embodiments, $H_3$ is equal to or less than about 30 μm. In some embodiments, $H_3$ is equal to or less than about 25 μm.

In the embodiment of FIG. 1A, contacts 135 are connected to metal lines 136, which provide electrical connections between bonded structures 125, 124, and 126. Metal lines 136 functions as a redistribution layer (RDL) and enables fan-out connection of die 120, which allows electrical connections beyond the edges (or boundaries) of die 120. The embodiment of FIG. 1A includes only one metal layer. However, a RDL (or RDLs) could include multiple metal layers, which could be interconnected by vias. In some embodiments, contacts 133 and 134 include an under bump metallurgy (UBM) layer 211, which may acts as a diffusion barrier layer between contacts 133, 134 with contacts 135 and a plating-enabling layer. Additional detailed description is provided below.

In some embodiments, widths of contacts 133 are in a range from about 20 μm to about 100 μm. In some embodiments, widths of contacts 134 are in a range from about 100 μm to about 400 μm. In the embodiment of FIG. 1A, contacts 135 include a conductive layer 208 and a barrier layer 205. Additional detailed description of these layers and formation method(s) is provided below.

Figure 1B:
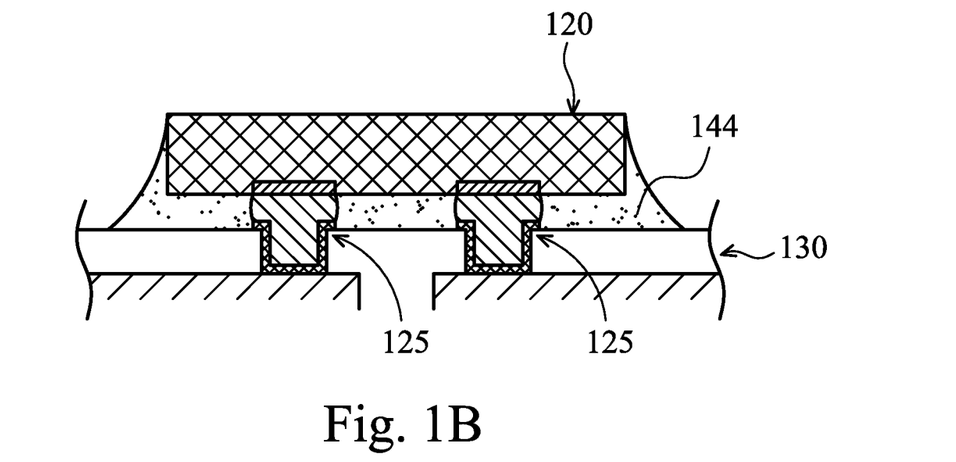
FIG. 1B is a cross-sectional view of a portion of a package, in accordance with some embodiments.

In the embodiment of FIG. 1A, package structure 110 is covered by a molding layer(or a molding compound) 145. In some embodiments, the molding layer 145 includes epoxy, silicon, silica filler, and/or other types of polymers. In the embodiment of FIG. 1A, molding layer 145 also fills a space between package structure 110 and interconnecting structure 130. In some embodiments, molding layer 145 also acts as an underfill (UF) and fills a space between die 120 and interconnecting structure 130. Under such circumstance, the molding layer 145 is an underfill molding (MUF) compound and is applied on a surface of interconnecting structure 130 after both die 120 and package structure 110 are bonded to interconnecting structure 130. In some embodiments, an underfill is applied after die 120 is bonded to interconnecting structure 130, as shown in FIG. 1B in accordance with some embodiments. After underfill is applied, package structure 110 is then placed over and bonded to interconnecting structure 130. A thickness of package structure 110 above interconnecting structure 130 is labeled as $H_4$ in FIG. 1A. In some embodiments, $H_4$ is in a range from about 350 μm to 1000 μm. A total thickness of package 110 and interconnecting structure 130 is labeled as $H_6$ in FIG. 1A. In some embodiments, $H_6$ is in a range from about 350 μm to 1050 μm. $H_6$ is lower than other packaging structures, such as in a range from about 1000 μm to about 1500 μm. Therefore, package 100 has low z-axial form factor (or total thickness of package 100).

Figure 1C:
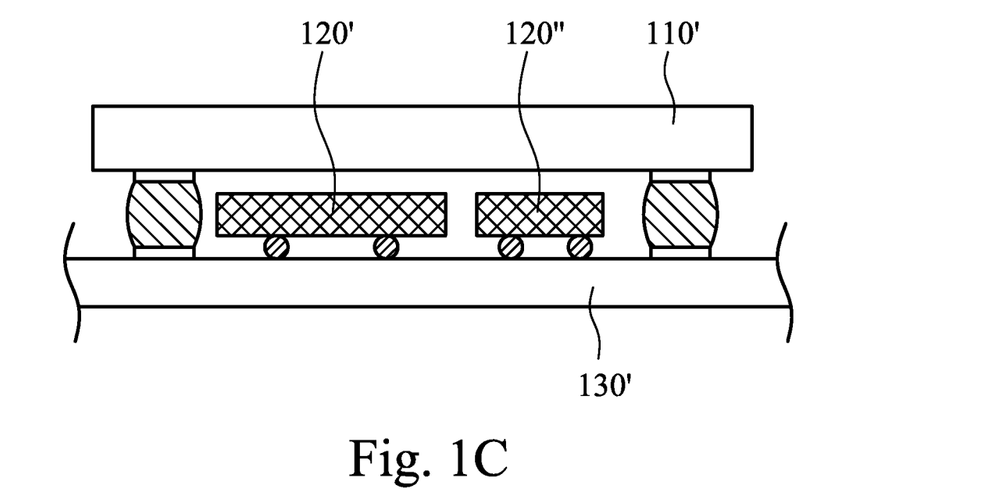
FIG. 1C is a cross-section view of two dies bonded to an interconnecting structure, in accordance with some embodiments.

In the embodiment of FIG. 1A, die 120 and package structure 110 are bonded to interconnecting structure 130. In some embodiments, there are more than one die underneath package structure 110. In the embodiment of FIG. 1C, two dies 120' and 120" are bonded to an interconnecting structure 130', in accordance with some embodiments. In the embodiment of FIG. 1C, a package structure 110' is placed over dies 120' and 120".

Figure 2A:
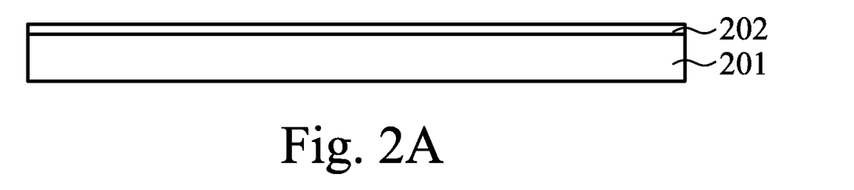
FIGS. 2A-2G are cross-sectional views of a sequential process flow of forming an interconnecting structure, in accordance with some embodiments.
Figure 2B:
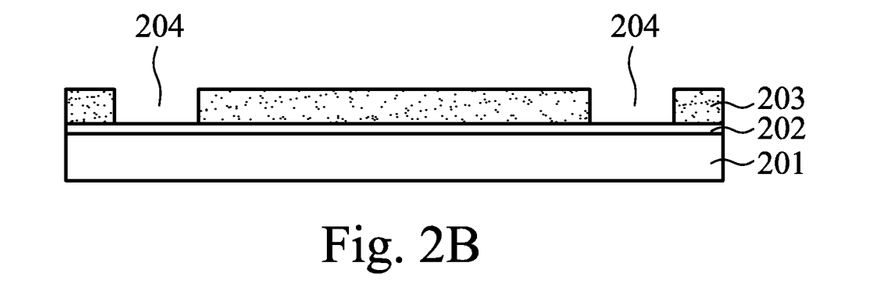

FIGS. 2A-2G are cross-sectional views of a sequential process flow of forming interconnecting structure 130, in accordance with some embodiments. In FIG. 2A, an adhesive layer 202 is formed on a carrier 201. Carrier 201 is made of glass, in accordance with some embodiments. However, other materials may also be used for carrier 201. Adhesive layer 202 is disposed, for example, laminated, on carrier 201. Adhesive layer 202 may be formed of a glue, or may be a lamination layer formed of a foil. After the adhesion layer 202 is formed, a passivation layer 203 is formed and patterned to form contact openings 204 on adhesion layer 202, as shown in FIG. 2B in accordance with some embodiments. In some embodiments, the passivation layer 203 is a dielectric material. In some embodiments, the passivation layer 203 is a polymer. In some embodiments, passivation layer 203 is a photo-sensitive polymer and can be patterned without a photoresist layer.

Figure 2C:
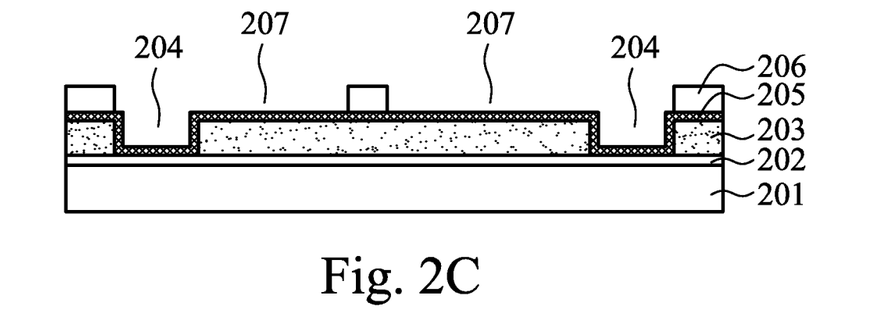

After contact openings 204 are formed, a barrier layer 205 is formed to cover exposed surfaces of passivation layer 203 on carrier 201, as shown in FIG. 2C in accordance with some embodiments. The barrier layer 205 is a conductive layer and prevents the diffusion of copper deposited to fill openings 204. In some embodiments, the barrier layer 205 is made of Ti. In some embodiments, a copper seed layer (not shown) is formed over the barrier layer 205. In some embodiments, the barrier layer 205 and/or the copper seed layer are deposited by physical vapor deposition (PVD). After the barrier layer 205 is formed, a photoresist layer 206 is then formed over the barrier layer. In FIG. 2C, a photoresist layer 206 is formed over barrier layer 205. The photoresist layer 206 is formed by a spin-on process (wet process) in some embodiments. In some other embodiments, the photoresist layer 206 is a dry photoresist layer, which is adhered to the surface of barrier layer 205, which may be covered by a copper seed layer (not shown). The photoresist layer 206 is then patterned to define openings 207 for forming interconnection, as shown in FIG. 2C.

Figure 2D:
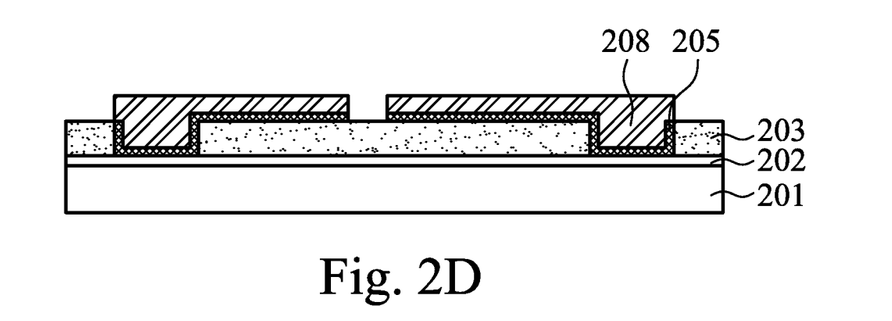

In FIG. 2D, a conductive layer 208 is formed in openings 207 and 204, in accordance with some embodiments. The conductive layer 208 is made of copper or a copper alloy in some embodiments. Conductive layer 208 includes metal(s) such as aluminum, nickel, gold, silver, platinum, alloy of the above-mentioned metals, or combinations thereof, in accordance with some embodiments. In some embodiments, the conductive layer 208 is formed by plating. Excess conductive layer 208, or regions of conductive layer 208 that are too thick, is removed by a removal process, such as chemical-mechanical polishing (CMP), in accordance with some embodiments. The photoresist layer 206 is then removed. For example, if photoresist layer 206 is a dry photoresist film, it can be removed by peeling. In some embodiments, the photoresist layer 206 is removed by an etching process. Portions of barrier layer 205 covered by the photoresist layer 206 is exposed after the photoresist layer 206 is removed. The exposed portions of barrier layer 205 is then removed as shown in FIG. 2D. In some embodiments, the exposed portions of barrier layer 205 are removed by an etching process.

Figure 2E:
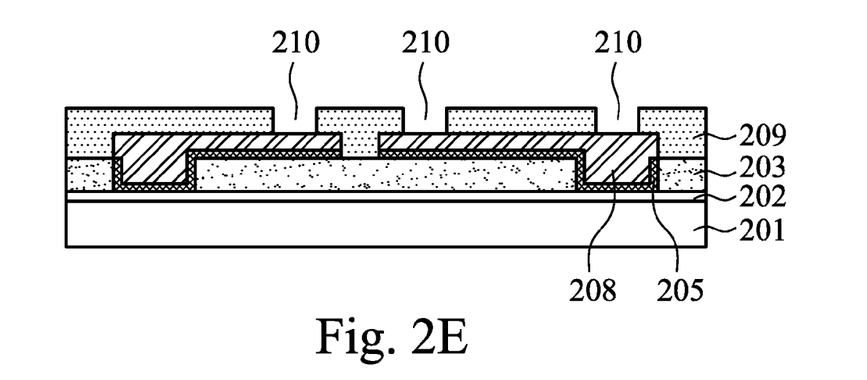

In FIG. 2E, another passivation layer 209 is deposited and patterned over passivation layer 203 and conductive layer 208, in accordance with some embodiments. In some embodiments, the passivation layer 209 is a dielectric material. In some embodiment, the passivation layer 209 is a polymer. In some embodiments, passivation layer 209 is a photo-sensitive polymer and can be patterned without a photoresist layer. The patterning process forms openings 210.

After openings 210 are formed, an under bump metallurgy (UBM) layer 211 is deposited on surfaces of passivation layer 209, in accordance with some embodiments. In some embodiments, the UBM layer 211 includes a diffusion barrier layer and a seed layer. The diffusion barrier layer may also function as an adhesion layer (or a glue layer), in some embodiments. The diffusion barrier layer may be made of Ta, TaN, Ti, TiN, or combinations thereof. The seed layer is made of a material for enabling later deposition of a conductive layer. In some embodiments, the UBM layer 211 includes a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) (or sputtering) methods.

Figure 2F:
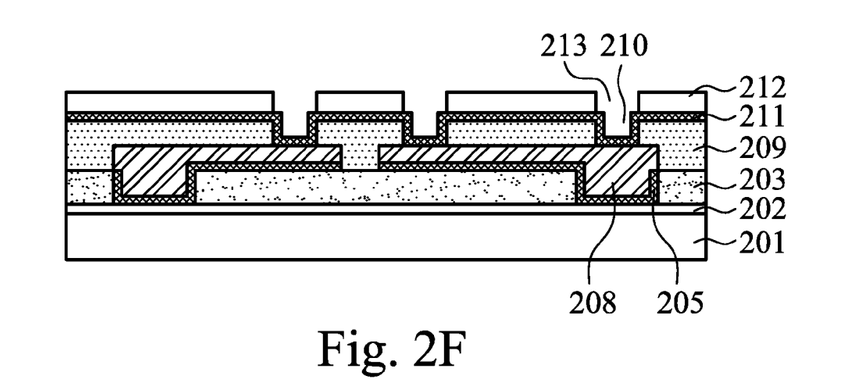

After UBM layer 211 is formed, a photoresist layer 212 is formed over the UBM layer, as shown in FIG. 2F in accordance with some embodiments. The photoresist layer 212 may be a dry or a wet photoresist. Photoresist layer 212 is patterned to define openings 213 that substantially align with openings 210. After the patterning process is completed, a conductive layer 214 is formed to fill openings 210 and 213. In some embodiments, the conductive layer 214 includes copper, aluminum, copper alloy, or other mobile conductive materials. In some embodiments, the conductive layer 214 is made of solder.

Figure 2G:
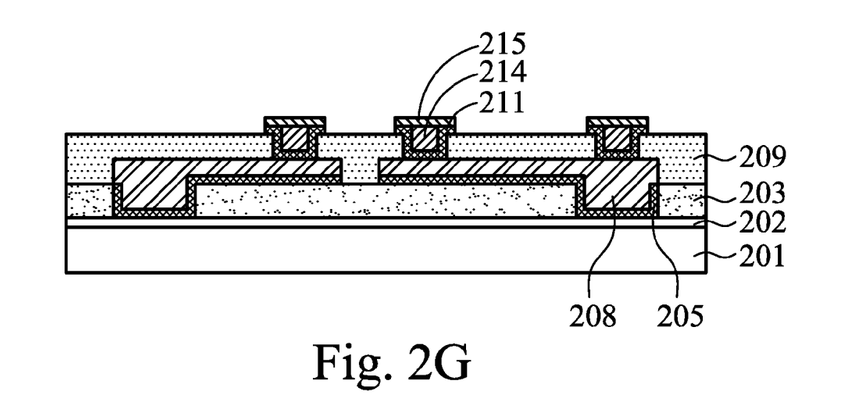

In some embodiments, the conductive layer 214 includes two sub-layers. One sub-layer is a metal layer, which is made of copper, aluminum, copper alloy, or other conductive materials with low resistivity. Another sub-layer that covers the previously-mentioned sub-layer is made of solder. In some embodiments, a protective layer 215 is formed to cover the conductive layer 214, as shown in FIG. 2G, in accordance to some embodiments. Protective layer 215 is optional in some embodiments. Afterwards, the photoresist layer 212 is removed and UBM layer 211 exposed by the removal of the photoresist layer is also removed. In some embodiments, the conductive layer 214 is deposited by plating. The protective layer 215 protects a surface of the conductive layer 214 from oxidation. In some embodiments, the protective layer is made of Ni, or one of organic surface protection (OSP) materials. In some embodiments, the UBM layer 211, the conductive layer 214, and the optional protective layer 215 form contacts 133 and 134. The contacts shown in FIG. 2G are contacts 133 or 134.

The UBM layer 211 and the conductive layer 214 form bump structures, in accordance with some embodiments. In some embodiments, the bump structures are copper posts. Exemplary details of materials, structures, and forming methods of forming copper posts are described in U.S. patent application Ser. No. 12/846,353, titled "Mechanisms for Forming Copper Pillar Bumps" and filed on Jul. 29, 2010, which is incorporated herein in its entirety. The structure formed over the adhesion layer 202, as shown in FIG. 2G, is interconnecting structure 130, in accordance with some embodiments.

Figure 3A:
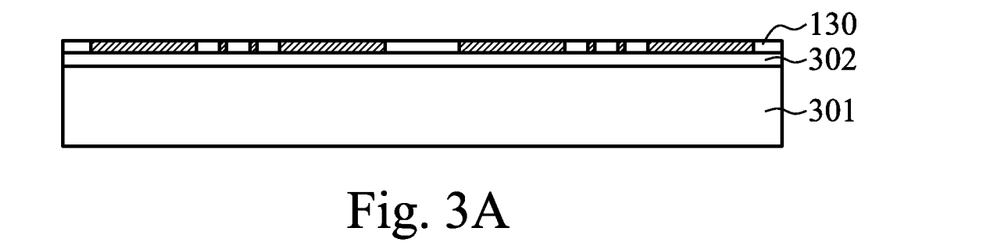
FIGS. 3A-3H are cross-sectional views of a sequential process flow of forming a package, in accordance with some embodiments.
Figure 3B:
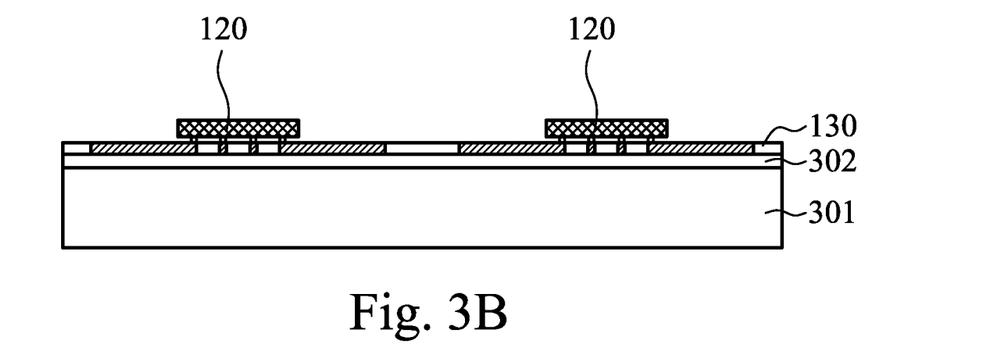

FIGS. 3A-3H are cross-sectional views of a sequential process flow of forming a package 100, in accordance with some embodiments. In the embodiment of FIG. 3A, interconnecting structure 130 is formed on an adhesive layer 302, which is over a carrier 301. The formation process and the features of the interconnecting structure 130, in accordance with some embodiments, have been described above in FIGS. 2A-2G. Carrier 301 is similar to carrier 201 and adhesion layer 302 is similar to adhesion layer 202, in some embodiments. After the interconnecting structure 130 is formed, dies 120 are placed over interconnecting structure 130, as shown in FIG. 3B in accordance with some embodiments. As shown in the more detailed view of FIG. 1A, contacts 122 on dies 120 are placed directly over and come in contact with contacts 133 of interconnecting structure 130. In some embodiments, a reflow process is performed to bond contacts 122 to contacts 133. After contacts 122 and 133 are bonded together, an underfill (UF) is applied to fill the space between dies 120 and the surface of interconnecting structure 130, in some embodiments. FIG. 1B shows an underfill 144 filing the space between dies 120 and the surface of interconnecting structure 130. As mentioned above, the reflow and the application of underfill are not performed in some embodiments, as shown in FIG. 3B.

Figure 3C:
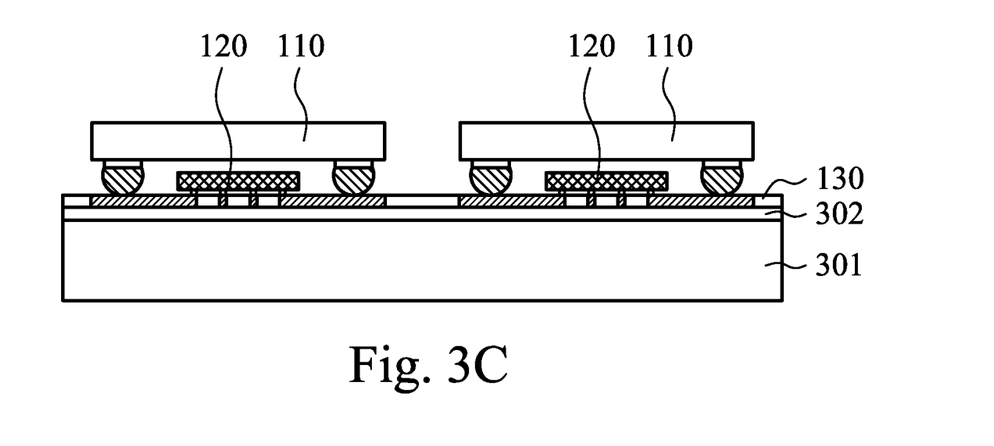

After dies 120 are placed on interconnecting structures 130, package structures 110 are placed on interconnecting structure 130, as shown in FIG. 3C in accordance with some embodiments. Connectors 119 on package structures 110 are placed directly over and come in contact with contacts 134 on interconnecting structure 130, as depicted in FIG. 1A. As mentioned above, contacts 134 are larger than contacts 133 because connectors 119 of package structure 110 are larger than contacts 122 on dies 120.

Figure 3D:
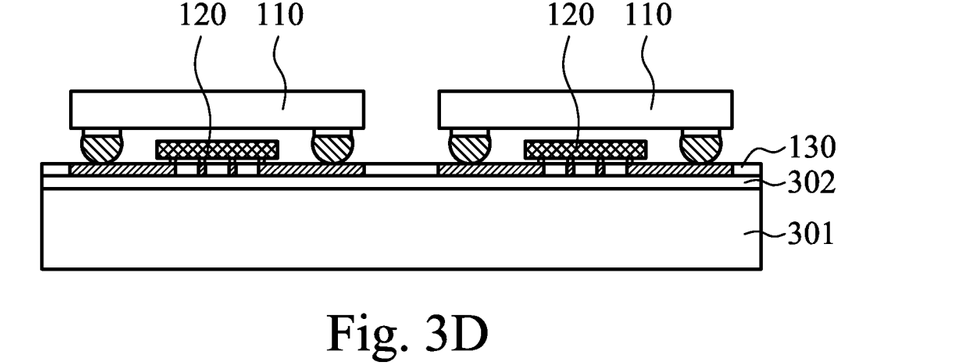

Afterwards, a reflow process is performed to bond contacts 134 with connector 119 and also to bond contacts 133 to contacts122, as shown in FIG. 3D in accordance with some embodiments. The reflow process bonds both dies 120 and package structures 110 to interconnecting structure 130. As mentioned above, a reflow could have been performed after dies 120 are placed on interconnecting structure 130. Under such circumstance, the reflow, as depicted in FIG. 3D, only bonds contacts 134 to connectors 119.

Figure 3E:
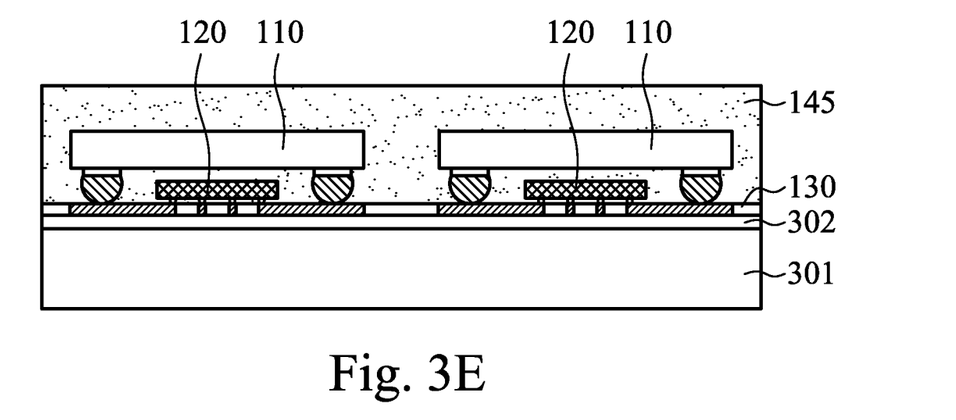

After the reflow process is completed, molding layer 145 is applied to cover package structures 110 and dies 120, as shown in FIG. 3E in accordance with some embodiments. As mentioned above, molding layer 145 also acts as an underfill (UF) and fills the space between die 120 and interconnecting structure 130 in some embodiments. While, in some other embodiments, molding layer 145 also under-fill die 120.

Figure 3F:
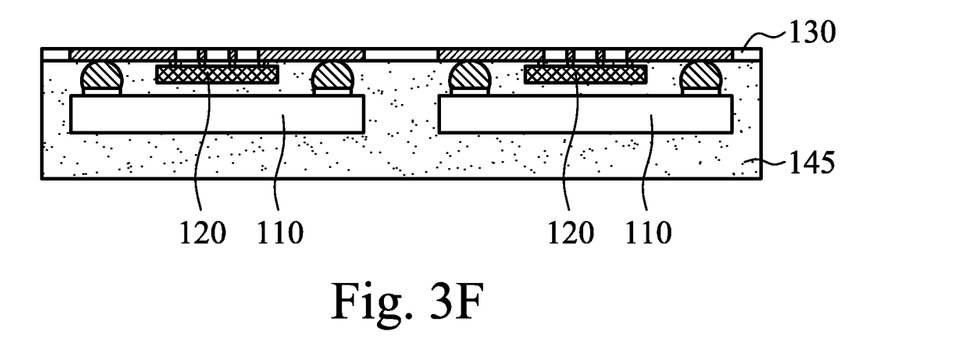

In FIG. 3F, carrier 301 and adhesion layer 302 are removed, in accordance with some embodiments. As mentioned in FIG. 2C, a barrier layer 205 is formed to line openings 204. The barrier layer 205, for example a Ti layer, is removed to expose conductive layer 208, which is made of copper in accordance with some embodiments.

Figure 3G:
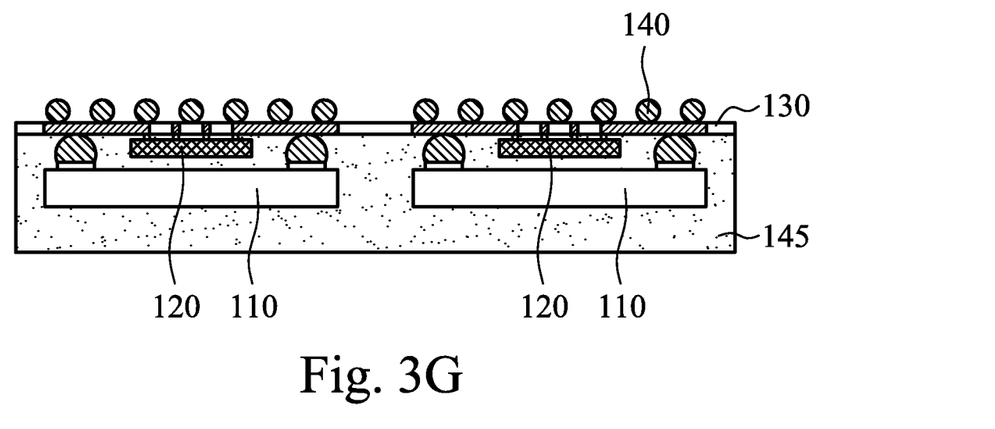

In FIG. 3G, connecting elements 140, such as solder balls, are mounted on a surface of interconnecting structure 130 to bond with contacts 135, in accordance with some embodiments. The bonding process also involves a reflow.

Figure 3H:
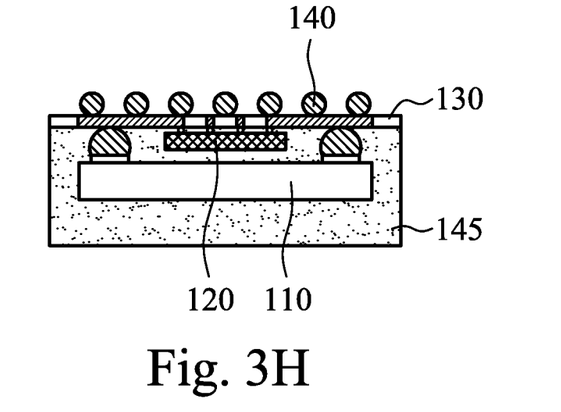

After the connecting elements 140 are bonded to the interconnecting structure 130, the package structure shown in FIG. 3G are secured to a tape, which is secured to a carrier (not shown). The carrier with the secured package structure of FIG. 3G then undergoes a sawing process to separate package 100 into individual packages. After the sawing process, the tape and carrier are separated from each package 100 (de-tape and de-bond from carrier). FIG. 3H shows a package 100 after the sawing and de-tape/de-bond processes.

The bonding structures formed between dies 120, package structure 110, connecting elements 140, and interconnecting structure 130 are merely some embodiments. Other types of bonding structures with different shapes and material layers are also possible.

The mechanisms of forming a semiconductor device package described above provide a low-cost manufacturing process due to the relative simple process flow. By forming an interconnecting structure with a redistribution layer(s) to enable bonding of one or more dies underneath a package structure, the warpage of the overall package is greatly reduced. In addition, interconnecting structure is formed without using a molding compound, which reduces particle contamination. The reduction of warpage and particle contamination improves yield. Further, the semiconductor device package formed has low form factor with one or more dies fit underneath a space between a package structure and an interconnecting structure.

In some embodiments, a semiconductor package is provided. The semiconductor package includes an interconnecting structure, and the interconnecting structure includes a redistribution layer (RDL). The semiconductor package also includes a semiconductor die bonded to the interconnecting structure by a first plurality of bonding structures, and the RDL of the interconnecting layer enables fan-out connection of the semiconductor die. The semiconductor die further includes a package structure bonded to the interconnecting structure by a second plurality of bonding structures, and the semiconductor die is placed in a space between the package structure and the interconnecting structure.

In some other embodiments, a semiconductor package is provided. The semiconductor package includes an interconnecting structure, and the interconnecting structure includes a redistribution layer (RDL). The interconnecting structure has a thickness equal to or less than about 30 µm. The semiconductor package also includes a semiconductor die bonded to the interconnecting structure by a first plurality of bonding structures, and the RDL of the interconnecting layer enables fan-out connection of the semiconductor die. The semiconductor package further includes a package structure bonded to the interconnecting structure by a second plurality of bonding structures, and the semiconductor die is placed in a space between the package structure and the interconnecting structure.

In yet some other embodiments, a method of forming a semiconductor package is provided. The method includes providing a carrier with an adhesive layer disposed thereon, and forming an interconnecting structure on the adhesive layer. The method also includes placing a semiconductor die on a surface of the interconnecting structure, and placing a package structure on the surface of the interconnecting structure. The semiconductor die fits in a space between the interconnecting structure and the package structure. The method further includes performing a reflow to bond the package structure to the interconnecting structure.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor package comprising:
   an interconnecting structure, wherein the interconnecting structure includes a first redistribution layer (RDL) and a second RDL spaced from the first RDL, and the interconnecting structure has a thickness equal to or less than about 30 µm;
   a semiconductor die bonded to the first RDL by a first bonding structure and bonded to the second RDL by a second bonding structure, wherein the first RDL of the interconnecting structure enables fan-out connection of the semiconductor die; and
   a package structure bonded to the first RDL by a third bonding structure and bonded to the second RDL by a fourth bonding structure, wherein the semiconductor die is between the package structure and the interconnecting structure.

2. The semiconductor package of claim 1, the interconnecting structure includes conductive structures surrounded by one or more dielectric layers.

3. The semiconductor package of claim 2, wherein the one of more dielectric layers are made of photo-sensitive polymers.

4. The semiconductor package of claim 1, further comprising a molding layer covering the package structure, wherein a total thickness of the interconnecting structure and the package structure with the molding layer is in a range from about 350 µm to about 1050 µm.

5. The semiconductor package of claim 1, wherein a distance between a first surface of the package structure and a second surface of the interconnecting structure is in a range from about 100 µm to about 400 µm, wherein the first surface is on a side of the package structure facing the second surface.

6. The semiconductor package of claim 1, wherein a plurality of connecting elements are bonded to the interconnecting structure on an opposite surface from the semiconductor die and the package structure.

7. The semiconductor package of claim 1, further comprising:
   another semiconductor die adjacent to the semiconductor die, wherein the other semiconductor die is bonded to the interconnecting structure and is between the package structure and the interconnecting structure.

8. The semiconductor package claim 1, wherein the package structure includes two or more semiconductor dies.

9. The semiconductor package of claim 1, wherein the interconnecting structure includes a first connector for forming the first bonding structure with the semiconductor die and a second connector for forming the third bonding structure with the package structure, wherein a first width of the first connector is smaller than a second width of the second connector.

10. The semiconductor package of claim 9, wherein the first connector and the second connector both include a barrier layer.

11. The semiconductor package of claim 9, wherein the first connector and the second connector both include a conductive layer.

12. The semiconductor package of claim 9, wherein the first width is in a range from about 20 µm to about 100 µm.

13. The semiconductor package of claim 9, wherein the second width is in a range from about 100 µm to about 400 µm.

14. The semiconductor package of claim 1, further comprising a connecting element attached to a first surface of the interconnect structure, wherein the semiconductor die is bonded to a second surface, opposite the first surface, of the interconnect structure.

15. The semiconductor package of claim 1, further comprising a molding compound wherein the molding compound fills a space between the semiconductor die and the package structure.

16. A semiconductor package comprising:
an interconnecting structure, wherein the interconnecting structure include a redistribution layer (RDL), wherein the interconnecting structure has a thickness equal to or less than about 30 μm;
a semiconductor die bonded to the interconnecting structure by a first plurality of bonding structures, wherein the RDL of the interconnecting structure enables fan-out connection of the semiconductor die; and
a package structure bonded to the interconnecting structure by a second plurality of bonding structures, wherein the semiconductor die is placed in a space between the package structure and the interconnecting structure.

17. A semiconductor package comprising:
an interconnecting structure, wherein the interconnecting structure comprises a first redistribution layer (RDL);
a semiconductor die bonded to the first RDL by a first bonding structure having a first width; and
a package structure bonded to the first RDL by a second bonding structure having a second width different from the first width, wherein the package structure is on an opposite side of the semiconductor die from the interconnecting structure, wherein an overall height of the semiconductor package ranges from about 350 microns (μm) to about 1050 μm.

18. The semiconductor package of claim 17, wherein the interconnecting structure further comprising a second RDL separated from the first RDL, the semiconductor die is bonded to the second RDL by a third bonding structure having the first width, and the package structure is bonded to the second RDL by a fourth bonding structure having the second width.

19. The semiconductor package of claim 18, wherein the semiconductor die is located between the second bonding structure and the fourth bonding structure.

20. The semiconductor package of claim 17, further comprising a molding layer, wherein the molding layer surrounds the package structure and fills a space between the semiconductor die and the interconnecting structure.

* * * * *